United States Patent [19]

Thantrakul

[11] Patent Number: 5,784,611
[45] Date of Patent: Jul. 21, 1998

[54] DEVICE AND PROCESS FOR IN-SYSTEM PROGRAMMING ELECTRICALLY ERASABLE AND PROGRAMMABLE NON-VOLATILE MEMORY

[75] Inventor: Virat Thantrakul, La Crescenta, Calif.

[73] Assignee: Seagate Technology, Inc., Scotts Valley, Calif.

[21] Appl. No.: 839,463

[22] Filed: Apr. 14, 1997

Related U.S. Application Data

[63] Continuation of Ser. No. 359,292, Dec. 19, 1994, abandoned.

[51] Int. Cl.$^6$ .................................................. G06F 9/06
[52] U.S. Cl. .................................................. 395/651
[58] Field of Search ........................... 395/651, 652, 395/653, 712

[56] References Cited

U.S. PATENT DOCUMENTS

| | | | |
|---|---|---|---|
| 4,430,704 | 2/1984 | Page et al. | 395/700 |
| 4,626,986 | 12/1986 | Mori | 395/700 |
| 4,663,707 | 5/1987 | Dawson | 395/700 |
| 5,269,022 | 12/1993 | Shinjo et al. | 395/700 |
| 5,274,816 | 12/1993 | Oka | 395/700 |
| 5,408,666 | 4/1995 | Menut et al. | 395/700 |
| 5,410,707 | 4/1995 | Bell | 295/700 |
| 5,444,861 | 8/1995 | Adamec et al. | 395/700 |

*Primary Examiner*—Kevin A. Kriess
*Attorney, Agent, or Firm*—Merchant, Gould, Smith, Edell, Welter & Schmidt

[57] ABSTRACT

In a computing system, an in-system programmer includes control logic embedded into the target microprocessor bus address decoder logic, and a memory module in the form of an external device that consists of one or more non-volatile memory chips. With the memory module attached, the microprocessor is led to believe that the in-system programmer is its main memory and the microprocessor turns over control of the computer system to the in-system programmer in an orderly fashion. Program execution comes directly from the in-system memory module. In a stand alone mode the in-system programmer does not require firmware to function. The stand mode is useful in executing temporary firmware without having to alter the target system memory. With embedded programming firmware the in-system programmer is capable of cloning itself in targets that use reprogrammable memory.

33 Claims, 7 Drawing Sheets

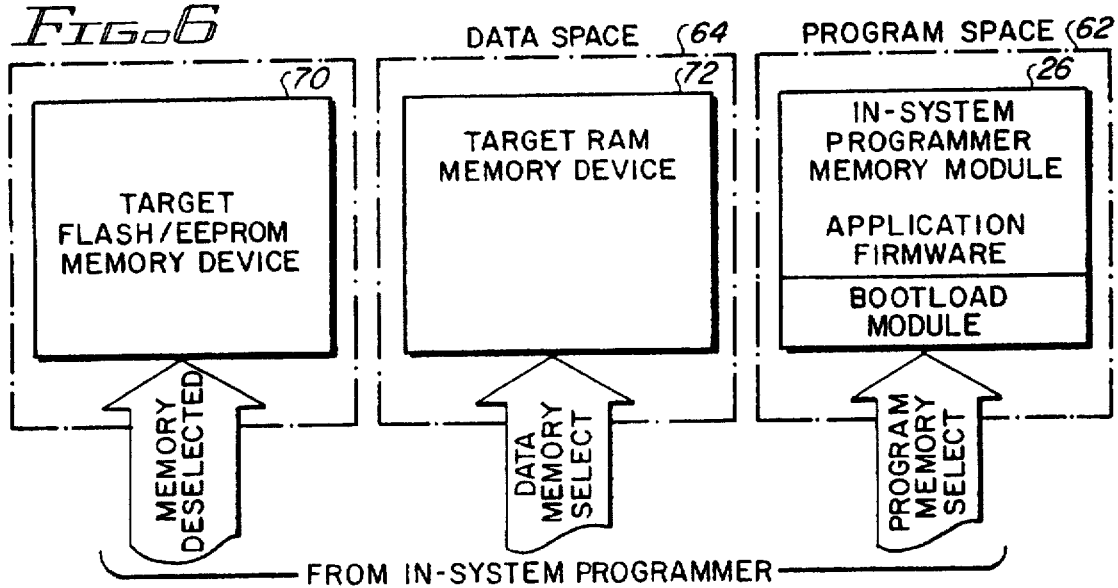
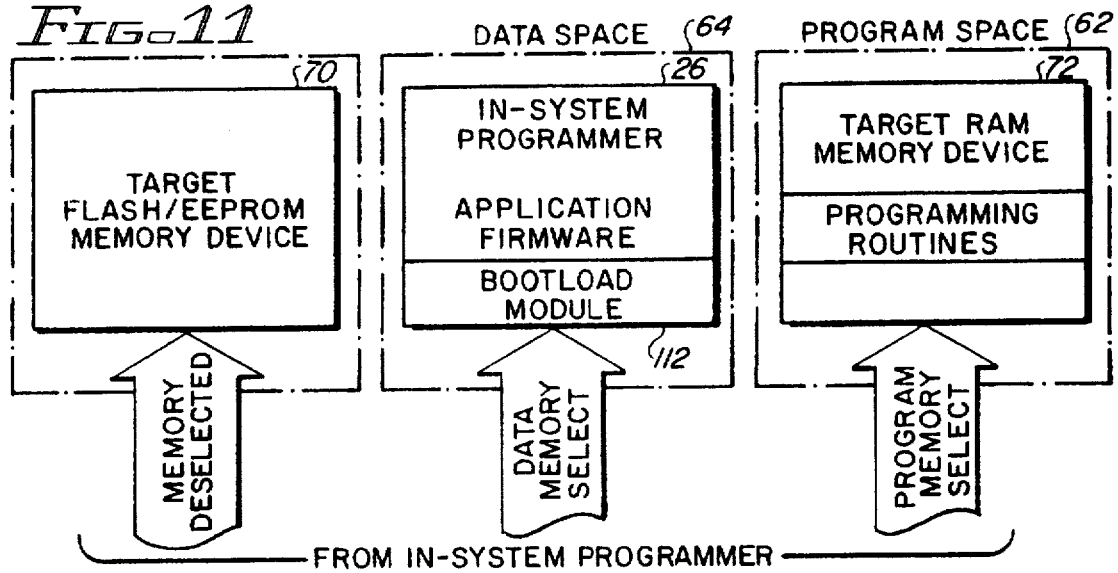
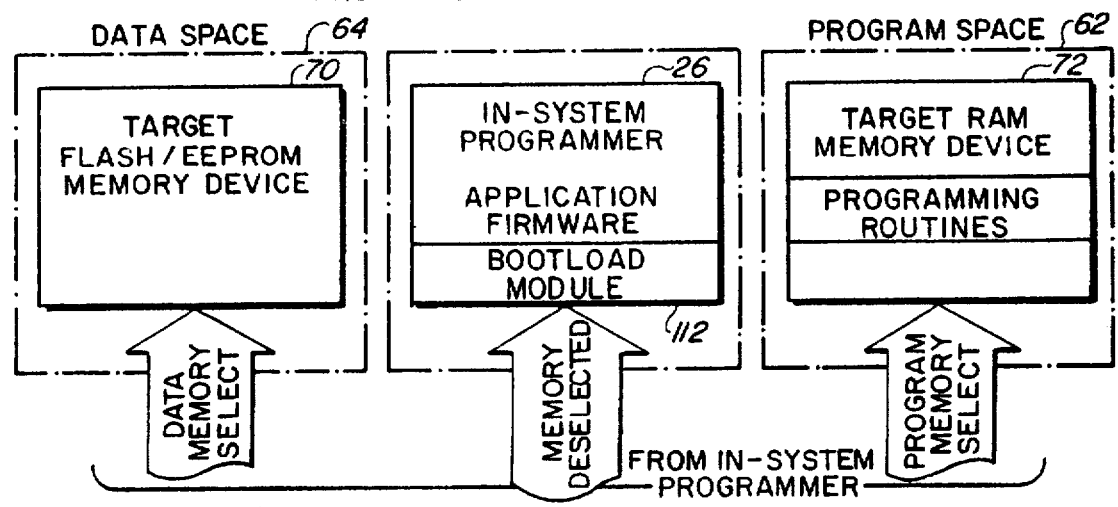

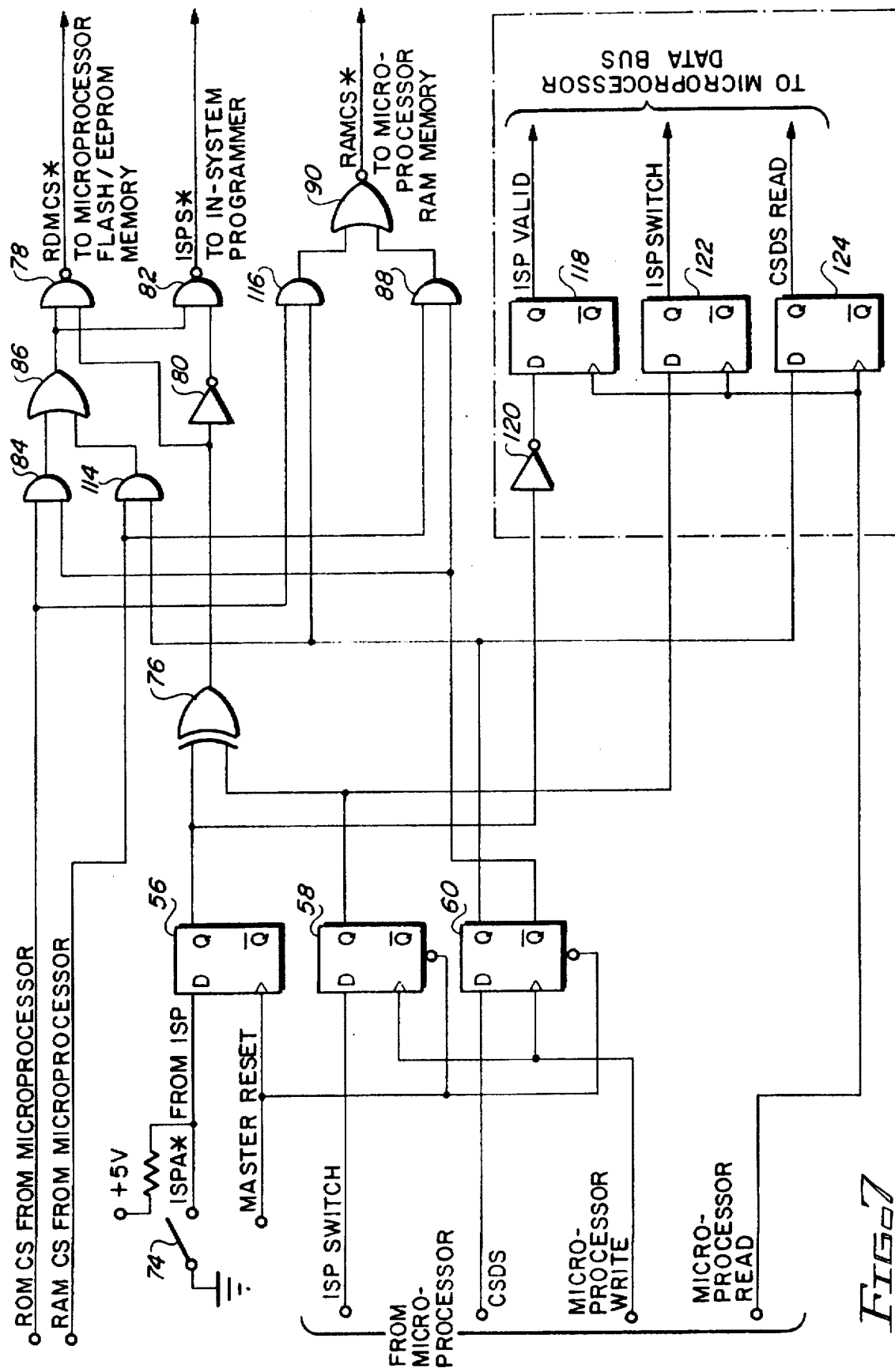

DEVICE AND PROCESS FOR IN-SYSTEM PROGRAMMING ELECTRICALLY ERASABLE AND PROGRAMMABLE NON-VOLATILE MEMORY

This is a continuation of application Ser. No. 08/359,292, filed Dec. 19, 1994, now abandoned.

BACKGROUND OF THE INVENTION

This invention relates generally to computers and computing systems. More specifically, the present invention relates to a system capable of electrically taking over a computer's microprocessor bus and optional embedded firmware, to redefine the system control logic functionality.

Today, computer architecture (micro/mini/super computer, etc.) requires a boot strap program at power up sequence to initialize its internal and peripheral logic before any data processing or control can take place. This set of instructions generally resides in some type of boot rom or non-volatile memory (rom or eprom). For an embedded microcontroller system (application specific vs. general computing), the application program in most cases is integrated with the boot strap program to save cost and board space. When a new program (firmware) is released, either to fix bugs or for general system improvement, the program memory (non-volatile rom/eprom) will need to be physically removed and replaced or reprogrammed. In addition, with the introduction of small surface mountable device (SMD) packaging technology, the device is usually soldered directly onto the printed circuit board making replacement very costly and in some cases not possible.

The recent introduction of FLASH/EEPROM (electrically erasable programmable read only memory) in the last few years has given hope that some of the problems can be solved. With flash/eeprom technology, it is now possible to to reprogram the memory device without physically removing the memory chip from the printed circuit board. Upgrading system application firmware by the end user is closer to reality. Manufacturers of embedded microcontroller systems can mass produce the end product prior to firmware completion and can be confident that firmware changes during manufacturing will not render the product obsolete. Unfortunately, most embedded microcontroller architecture does not lend itself to reprogramming its own program memory. In addition, the flash/eeprom memory does not allow the microprocessor to access its memory contents while it is being reprogrammed. This presents a catch-22 situation where the programming instructions needed by the microprocessor to reprogram the flash/eeprom device reside in the very same memory chip that is being programmed. To make matters worse, a power failure that occurs during programming will result in data corruption. Depending on the location of the data corruption, the power failure may cause the entire device to malfunction or to become permanently inoperative. All flash/eeprom must be preprogrammed prior to installation onto the printed circuit board to function.

There are two methods currently in use to solve the flash/eeprom problems mentioned above. One solution puts the microprocessor into a long sleeping mode. The microprocessor wakes up only to the flash interrupt signal upon completion of the programming sequence. The flash memory then allows the microprocessors to access the necessary instructions for the next operation. This solution advantageously requires minimum interface hardware, and minimum cost is incurred. However, not all microprocessors can support nonmaskable interrupt. Further, forcing the microprocessor into a long sleeping mode increases programming time, critical real time application interrupt cannot be serviced while in the programming mode, and this solution is vulnerable to power failure interruption that could render the target device permanently inoperative. Moreover, this solution is unique to one type of flash memory from Intel only, the microprocessor must be capable of writing to program memory space, and the flash memory device must be preprogrammed prior to soldering onto the printed circuit board for the target device to function.

A more general purpose solution is to add an additional boot rom to the program memory space on top of the target flash memory device. This solution actually adds back the very same rom/eeprom that is intended to be removed in the first place. The logic behind this solution is that the code inside the boot rom will be very small, and the likelihood of bugs and required rom/eeprom replacement will be negligible. A hardware memory control logic will also be needed to handle the additional rom/eeprom program memory space and should have the ability to write into the program memory space.

This solution advantageously does not require preprogrammed flash/eeprom prior to board installation (SMD), nor does power interruption cause catastrophic failure. Additionally, this solution is custom tailored to individual application needs. However, this solution adds substantial cost and time to the design, and adds design complexity and board space. Further, this solution does not totally eliminate the possibility of rom/eeprom replacement.

Neither of the above solutions is acceptable for a low cost mass production design. The ideal solution should add little or no cost to the end product, must not be susceptible to the side effect of catastrophic failure, and preferably should be usable across all flash and microprocessor products on the market.

Accordingly, there is a need for a simple and cost effective system that allows an external device to take control of the microprocessor bus with products that use memory external to the microprocessor. Such a system should allow the on-board flash/eeprom memory to be programmed regardless of the condition of prior data content. Additionally, the system should shift the majority of added cost from the end product to the external module, where a small quantity of these modules in the production line could be reusable. Moreover, the interface should be generic and should not suffer from power interruption catastrophic failure. The present invention fulfills these needs and provides other related advantages.

SUMMARY OF THE INVENTION

The present invention resides in a process for in-system programming electrically erasable and programmable non-volatile memory in a computer system. The process utilizes an in-system programmer having control logic embedded into the target microprocessor bus address decoder logic, and a memory module comprising an external device that is connectable to the bus of the target microprocessor. In a stand alone mode the in-system programmer does not require firmware to function. The hardware automatically takes care of all signals switching in real time. The in-system programmer in the stand alone mode lends itself for applications that require execution of temporary firmware without having to alter the target system memory. In contrast, when provided with embedded programming firmware the in-system programmer is capable of cloning itself in targets that use reprogrammable memory.

The process broadly comprises the steps of connecting the memory module of the in-system programmer to the microprocessor bus, and enabling control logic for the in-system programmer such that the microprocessor fetches instructions from the memory module rather than an on-board flash/eeprom memory. More specifically, the process includes the steps of detecting attachment of the memory module to the target microprocessor bus on power-up of the computer system, inhibiting on-board flash/eeprom memory selection logic of the computer system and, after the in-system programmer control logic has been enabled, executing in-system firmware embedded in the memory module.

When used in the stand alone mode, after the in-system firmware embedded in the memory module has been executed, the process includes the steps of removing the memory module from the target microprocessor bus, detecting disattachment of the memory module from the target microprocessor bus, disabling the in-system programmer control logic, and enabling the on-board flash/eeprom memory selection logic such that the microprocessor fetches instructions from the on-board flash/eeprom memory rather than the memory module. The embedded application firmware of the on-board flash/eeprom memory may then be executed rather than the in-system firmware embedded in the memory module.

Alternatively, when the in-system programmer is to be utilized to clone itself, the process for programming electrically erasable and programmable memory includes the steps of connecting the memory module to a bus of a target microprocesser, enabling control logic for the in-system programmer such that the microprocessor fetches instructions from the memory module rather than an on-board flash/eeprom memory, swapping ram memory in a data space into a program space and in-system firmware into the data space, and cloning at least a portion of the in-system firmware within the on-board flash/eeprom memory. More particularly, the cloning step includes the steps of reading data to be copied from the in-system firmware into a buffer memory/internal register, swapping the in-system programmer firmware out of the data space and the on-board flash/eeprom memory into the data space, and writing data from the buffer memory/internal register to the on-board flash/eeprom memory. Further, the process includes the step of copying programming routines within the memory module to the ram memory in the data space prior to swapping the ram memory into a program space.

An erase operation on the on-board flash/eeprom memory may be performed, if required, prior to the step of copying data from the in-system firmware to the on-board flash/eeprom memory. The erase operation performing step includes the steps of swapping the in-system firmware out of the data space and the on-board flash/eeprom memory into the data space prior to erasing the on-board flash/eeprom memory, and swapping the on-board flash/eeprom memory out of the data space and the in-system firmware back into the data space afterwards.

Other features and advantages of the present invention will become apparent from the following more detailed description, taken in conjunction with the accompanying drawings which illustrate, by way of example, the principles of the invention.

BRIEF DESCRIPTION OF THE DRAWINGS

The accompanying drawings illustrate the invention. In such drawings:

FIG. 6 is a microprocessor memory map similar to FIG. 4, wherein the in-system programmer memory module, in contrast with FIG. 5, is provided with embedded programming firmware and a bootload module which permit the in-system programmer to clone itself in targets that use reprogrammable memory;

FIG. 7 is a wiring diagram illustrating hardware utilized in the in-system programmer in both the stand alone mode (FIG. 5) and with the bootload module (FIG. 6);

FIG. 11 is a microprocessor memory map similar FIGS. 6 and 10, illustrating the in-system programmer program/data memory space swap; and FIG. 12 is a microprocessor memory map similar to FIGS. 6, 10 and 11, illustrating execution of flash programming routines as directed by the in-system programmer, in accordance with the present invention.

DETAILED DESCRIPTION OF THE PREFERRED EMBODIMENTS

Figure 1:
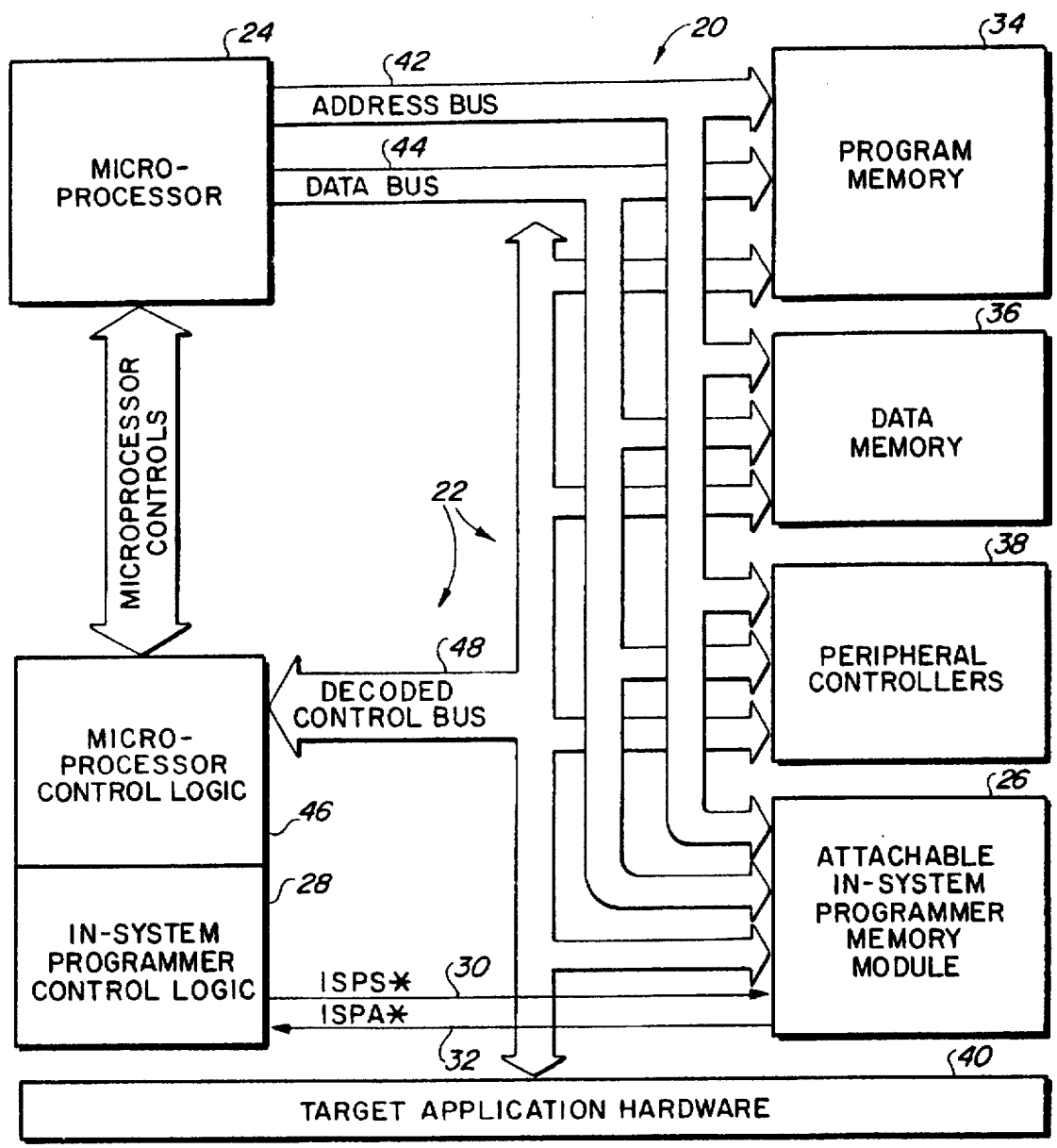
FIG. 1 is a schematic illustration of the general relationship between a device for in-system programming electrically erasable and reprogrammable non-volatile memory, embodying the present invention, and typical microprocessor bus interface signals.

As shown in the drawings for purposes of illustration, the present invention is concerned with a device for in-system programming electrically erasable and reprogrammable non-volatile memory, which device shall be referred to herein as the "in-system programmer". The in-system programmer design is based on the ability of a computing system 20 to take over a microprocessor bus 22 from an external device in a nonintrusive way as part of a total system design. In the programming mode, a microprocessor 24 is led to believe that the in-system programmer is its main memory, and the microprocessor turns over system 20 control in an orderly fashion. Once the microprocessor bus 22 is under in-system processor control, program execution will come directly from an in-system programmer memory module 26. The in-system programmer of the present invention is cost effective, flexible, simple and reliable. The end user can use the in-system programmer to upgrade firmware and to insure against hardware obsolescence. Manufacturers can use the in-system programmer to reduce processing time and cost as well as to increase testability of the computing system 20.

Advantageously, the in-system programmer does not require preprogrammed flash/eeprom prior to board installation (SMD type), and is generic to all microprocessors and flash/eeprom memory on the market. Power interruption does not cause catastrophic failure, and use of the in-system programmer results in no prom/eeprom requiring replacement. Further, the in-system programmer can be incorporated into production board testers to combine testing and programming flash/eeprom in one step and to eliminate the hardware interconnection requirement, and its design results in minimum added cost to the end product. In most cases, the system ASIC chip can handle small additional logic gates without increased cost.

In accordance with the present invention, and with reference to FIG. 1, the in-system programmer is divided into two parts: the in-system programmer control logic 28 and the memory module 26. The interface between the control logic 28 and the memory module 26 requires two extra signal lines 30 and 32 above normal microprocessor bus 22 interface signals. As shown, the microprocessor 24 of the computing system 20 is connected to a program memory 34, a data memory 36, peripheral controllers 38 and target application hardware 40 by means of an address bus 42 and a data bus 44. The microprocessor 24 is also linked to a control logic decoder 46 which, in turn, is linked to the program memory 34, the data memory 36, the peripheral controllers 38 and the target application hardware 40 through a decoded control bus 48. The in-system programmer control logic 28 is embedded into the target microprocessor bus address decoder logic 46 as part of the final product. The control logic 48 consists of input/output firmware control registers and input/output electrical control interface signals.

Figure 2:
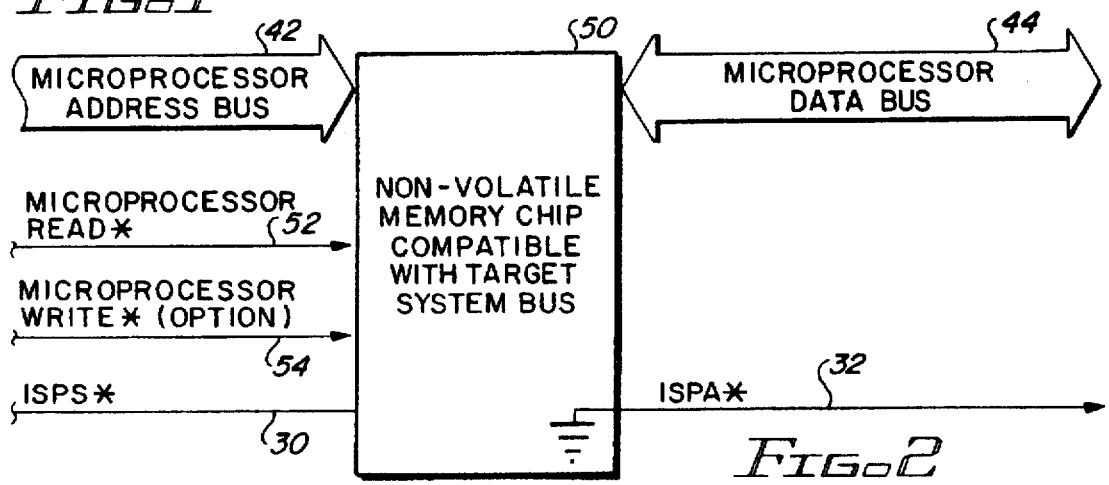
FIG. 2 is a schematic illustration of an attachable in-system programmer memory module, shown in FIG. 1, in the form of a non-volatile memory chip.

The in-system programmer memory module 26 is an external device that consists of one or more non-volatile memory chips 50 (see FIG. 2) attached to a suitable carrier (PCB, flex circuit, IC clip adapter, etc.) with an appropriate connection device (connector, IC clip, test pin, etc.) built into the module 26. All interface signals with the memory module 26 except those carried on the signal lines 30 and 32 are generic to standard memory interface (address bus 42, data bus 44, control signals, power and ground). The in-system programmer select (ISPS) signal line 30 is tied directly to the chip select pin of the memory chip 50, and the in-system programmer attached (ISPA) signal line 32 is tied to ground or zero logic.

The memory module 26 is capable of electrically attaching to the target microprocessor bus 22 by means of a hardware connection in several different ways. One is to use off-the-shelf mating connectors that are suitable for the target board. The suitability is highly dependent upon each individual application's needs and requirements. The memory module 26 resides on a mating daughter board. A second option is to utilize a specially designed IC chip clip module that contains all the in-system programmer memory (and support logic if so required) that directly attaches to the target microprocessor 24 or one of its peripheral IC chips that have direct access to the microprocessor memory's bus. A third option integrates the in-system programmer memory module 26 with the board tester in the production environment. The tester (in-circuit tester or functional test) directly probes the in-system programmer bus on the printed circuit board.

The electrical interconnection between the in-system programmer memory module 26 and the target system 20 (microprocessor bus 22 and in-system programmer control logic 28 on the target board) is called the "in-system programmer bus". The in-system programmer bus includes the target system memory address bus 42 (the microprocessor address bus plus any additional extension memory manager/controller addresses), the target system memory data bus 44, the additional signal lines 30 and 32, a microprocessor read signal line 52, and an optional microprocessor write signal line 54. (See FIG. 2). The ISPA (in-system programmer attached) signal line 32 carries a signal from the memory module 26 to the in-system programmer control logic 28 that indicates the presence of the memory module and activates the in-system programmer function on the target board. The ISPS (in-system programmer selected) signal line 30 carries a signal from the in-system programmer control logic 28 on the target board to the memory module 26. Upon detection of the memory module 26 at power-up reset of the computing system 20, this signal is substituted with the target microprocessor main memory chip select signal(s). The microprocessor read signal line 52 carries a read or output enable signal from the microprocessor control bus to fetch program and data directly from the in-system programmer memory module 26. The microprocessor write signal line 54 carries a write signal from the target microprocessor control bus to write data directly to the in-system programmer memory module 26. (This signal is optional.)

The in-system programmer bus further includes three control registers, namely an ISP VALID register 56, an ISP SWITCH register 58, and a CSDS register 60. The ISP VALID register is a read only status bit. When set, this register bit indicates that the memory module 26 is attached and in control of program memory space 62. Otherwise, it indicates processor execution takes place from the target main program memory 34. The ISP SWITCH register 58 is a read/write control bit. When set, this register bit forces the H/W control logic to select the target main program memory 34 instead of the in-system programmer memory. This register bit is only valid when ISP VALID is set. The CSDS register is a read/write control bit. When set, this register bit forces the H/W control logic to swap the target program memory space 62 with data memory space 64.

Figure 3:
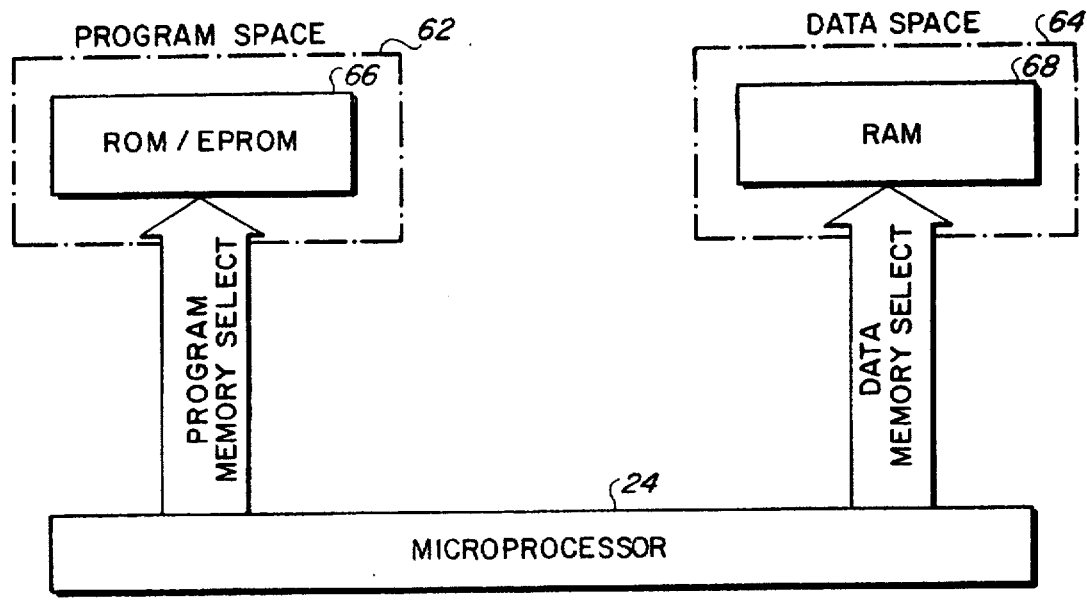
FIG. 3 is a typical microprocessor memory map.
Figure 4:
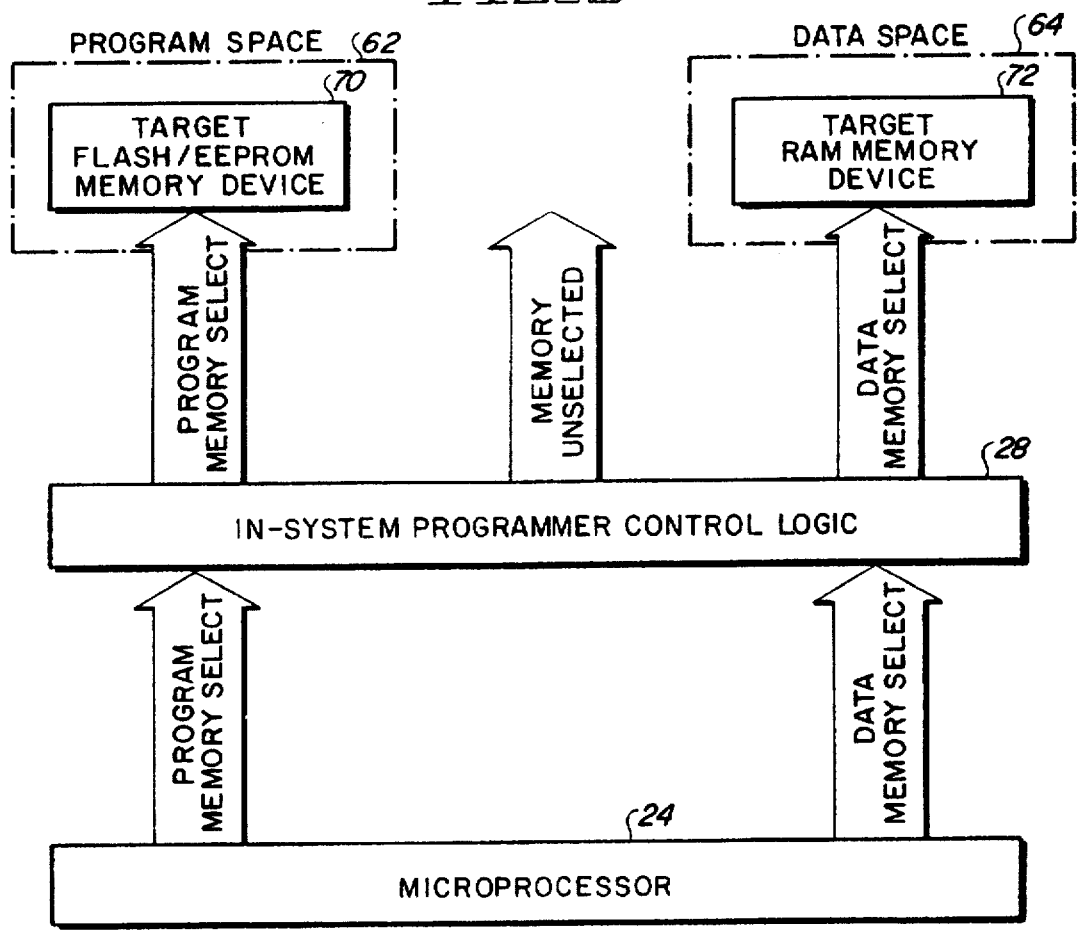
FIG. 4 is microprocessor memory map similar to FIG. 3, showing modifications made to support the device for in-system programming electrically erasable and reprogrammable non-volatile memory of the present invention.

To better understand the function of the in-system programmer of the present invention, reference is made to FIG. 3 which illustrates a typical microprocessor memory map, where the microprocessor 26 has selected ROM/EPROM 66 as the program memory space 62 and the RAM 68 as the data memory space 64. In contrast, FIG. 4 illustrates a similar microprocessor memory map wherein the in-system programmer control logic 28 is interposed between the microprocessor 24 and a target FLASH/EEPROM memory device 70 and a target RAM memory device 72. It will be noted that the in-system programmer control logic 28 gives the system 20 the option of selecting an external memory device such as the in-system programmer memory module 26.

Figure 5:
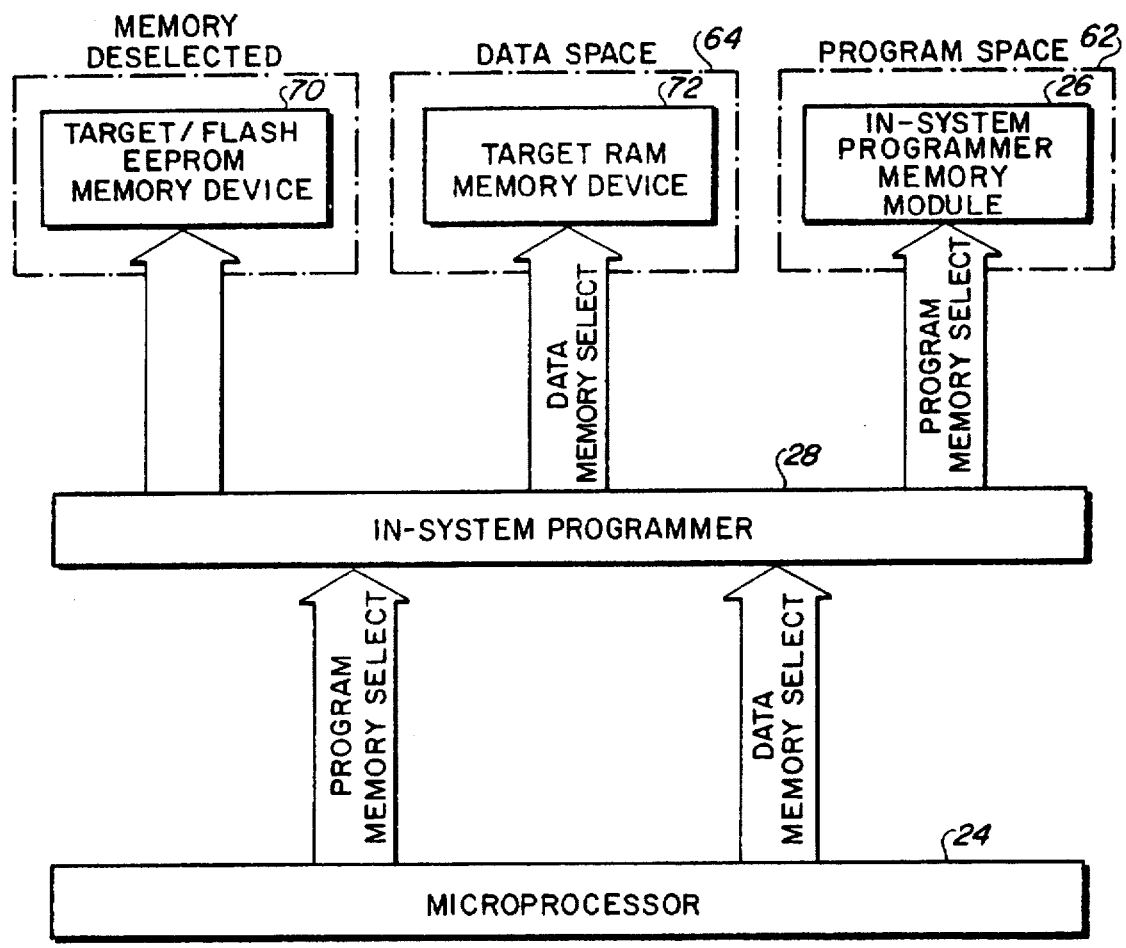
FIG. 5 is a microprocessor memory map similar to FIG. 4, illustrating the use of the in-system programmer in a stand alone mode.

FIG. 5 illustrates the in-system programmer in a stand alone mode. In the stand alone mode the in-system programmer does not require firmware to function. The hardware automatically takes care of all signals switching in real time. Any application firmware that runs on the target system 20 can be run on the in-system programmer memory module 26. The in-system programmer lends itself in the stand alone mode for applications that require execution of temporary firmware without having to alter the target system memory 70 (such as tests, diagnostic, calibration, data collection, data encoder/decoder, etc.).

FIG. 6 illustrates an embodiment of the in-system programmer wherein the memory module 26 is provided embedded programming firmware that allows the in-system programmer to clone itself (smart flash/eeprom programmer) in targets that use reprogrammable memory (flash/eeprom and non-volatile ram, etc.). The in-system programmer firmware is a set of instructions written in the native language of target processor to control the functionality of the in-system programmer logic. In an embedded application environment (FIG. 6), the in-system programmer control firmware is embedded inside the target application. It will stay dormant indefinitely and can only be activated by the presence of the in-system programmer memory module 26 prior to the power-up reset sequence of the computing system 20. This makes the in-system programmer available on demand at any time.

Referring now to the circuit diagram of FIG. 7, the in-system programmer control logic 28 consists of control/status registers and chip select multiplexors. To invoke operation of the in-system programmer, one need only attach the memory module 26 to the microprocessor bus 22 via a connector, IC clip, etc., prior to applying power to the target device.

Figure 8:
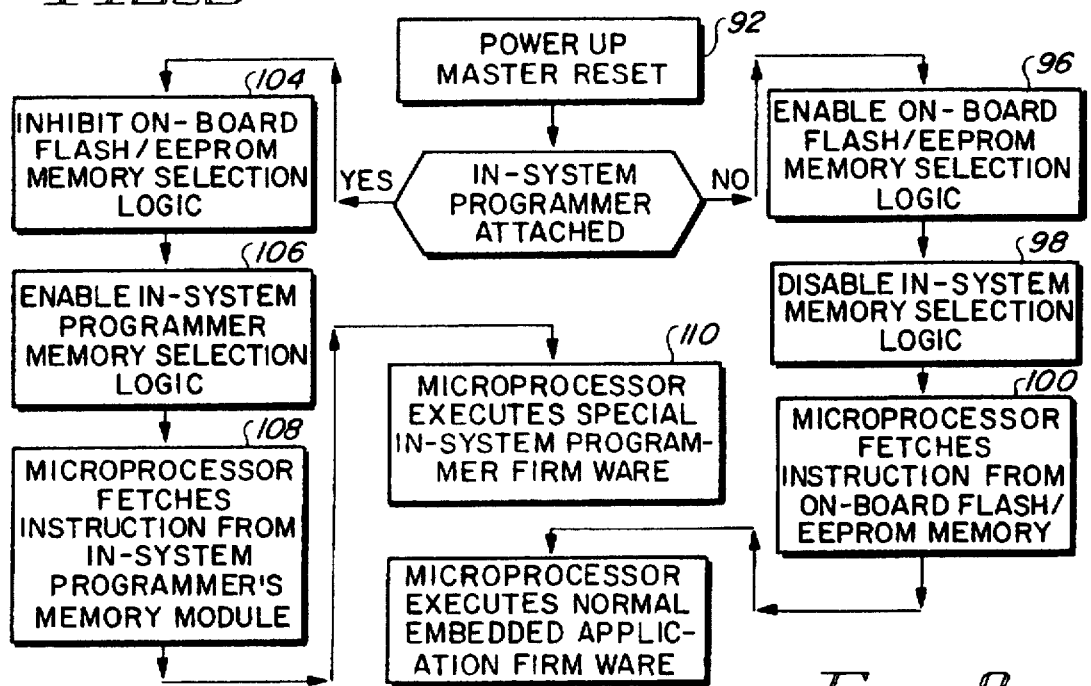
FIG. 8 is a flow diagram illustrating the hardware control logic of the in-system programmer in the stand alone mode (FIG. 5)

To invoke the in-system programmer in the stand alone mode, and with reference to FIGS. 5, 7 and 8, when the memory module 26 is attached to the microprocessor bus 22, the switch 74 closes. Applying power to the target device, the D input of the ISP VALID register 56 senses that the input logic is low to indicate that the memory module 26 is attached and the in-system programmer function is being invoked. The microprocessor master reset signal, after a brief period of time from power-up, will go high and set a logic low at the Q output of the ISP VALID register 56, the ISP SWITCH register 58 and the CSDS register 60. The output of exclusive or gate 76 is forced low which in turn disables and gate 78 and causes the on-board flash memory 70 in the program memory space 62 to be deselected. At the same time, the inverter 80 enables and gate 82 to select the memory module 26 in place of the on-board flash memory 70.

Each time the microprocessor 24 fetches instructions from its program memory space 62, the ROM CS* signal becomes valid (logic high). The ROM CS* signal combined with the logic high from Q* output of the CSDS register 60 causes the output of both the and gate 84 and the or gate 86 to be valid (logic high) and enables the and gate 82 to produce the valid ISPS* signal (logic low). When the microprocessor 24 accesses the data memory space 64, the RAM CS* signal becomes valid (logic high). The RAM CS* signal combined with the logic high from Q* output of the CSDS register 60 causes the output of and gate 88 to be valid (logic high) and forces the output of or gate 90 to produce the valid RAM CS* signal (logic low), and the data memory space 64 is selected. In this mode, the firmware residing in the memory module 26 will take over all functionality of the target board while the data memory space 64 remains unaltered until the next power-up sequence (see FIGS. 3 and 4).

As illustrated in FIG. 8, the hardware control logic for the in-system programmer in the stand alone mode begins with a power-up master reset (block 92). The in-system programmer control logic 28 then determines whether or not the memory module 26 is attached (block 94). If the memory module 26 is not attached, the on-board flash/eeprom memory selection logic is enabled (block 96), and the in-system programmer memory selection logic is disabled (block 98). The microprocessor 24 then fetches instructions from the on-board flash/eeprom memory 70 (block 100), and then normal embedded application firmware is executed by the microprocessor (block 102). Conversely, if the memory module 26 is attached, the on-board flash/eeprom memory selection logic is inhibited (block 104), and in-system programmer memory selection is enabled (block 106). The microprocessor 24 then fetches instructions from the in-system programmer memory module 26 (block 108), and executes the special in-system programmer firmware (block 110).

To invoke the in-system programmer with boot rom firmware, and with reference to FIGS. 6, 7 and 9–12, the power-up sequence is identical to that described above. In addition to the normal target application firmware (source data to be programmed onto the target flash memory 70) residing in the memory module 26, a small set of special function boot load firmware (boot load module 112) is inserted between the microprocessor power-up instruction fetch address (boot address) and the normal target application firmware. The actual location is microprocessor dependent. The boot load firmware of the boot load module 112 first initializes all necessary hardware and software registers and memories. It copies parts of the boot load firmware (flash/eeprom programming routines) to RAM memory in the data space 64 (see FIG. 10) at some predetermined load address. Once the boot load firmware is in the data space 64, writing to the register 60 with the CSDS bit set clocks the Q output to logic high and the Q* output to logic low. This immediately disables the and gate 88 and the and gate 84 output and enables and gate 114 and gate 116 instead. The effect is the swapping of the program memory space 62 with data memory space 64 (see FIG. 11). The microprocessor program counter remains unaltered and continues fetching the next instruction at the beginning of the previously determined load address of flash/eeprom programming routines. As a safety precaution, at least one or more "no-op" instructions should be used at the entry point to insure no instruction glitches occur during the memory space swapping operation.

Once the ram base flash/eeprom programming routines are invoked, the entire data memory space 62 (in-system programmer memory module 26 or on-board flash/eeprom 70) is treated as read/writable memory. By writing to the register 58 and by setting the ISP SWITCH bit high, the exclusive or gate 76 output is forced to be set (logic high) which in turn disables the and gate 82 and enables the and gate 78. The effect is the swapping of the on-board flash/eeprom memory 70 with the memory module 26 in the data memory space 64 (see FIG. 12). This action allows the copying or programming of either memory device to another device (if both are programmable) by reading the source data from one device, swapping the flash/eeprom memory module, and writing to another. This sequence is repeated until the programming is done. Register 118 (through inverter 120), register 122 and register 124 provide in-system programmer status to the control firmware logic.

Figure 9A:
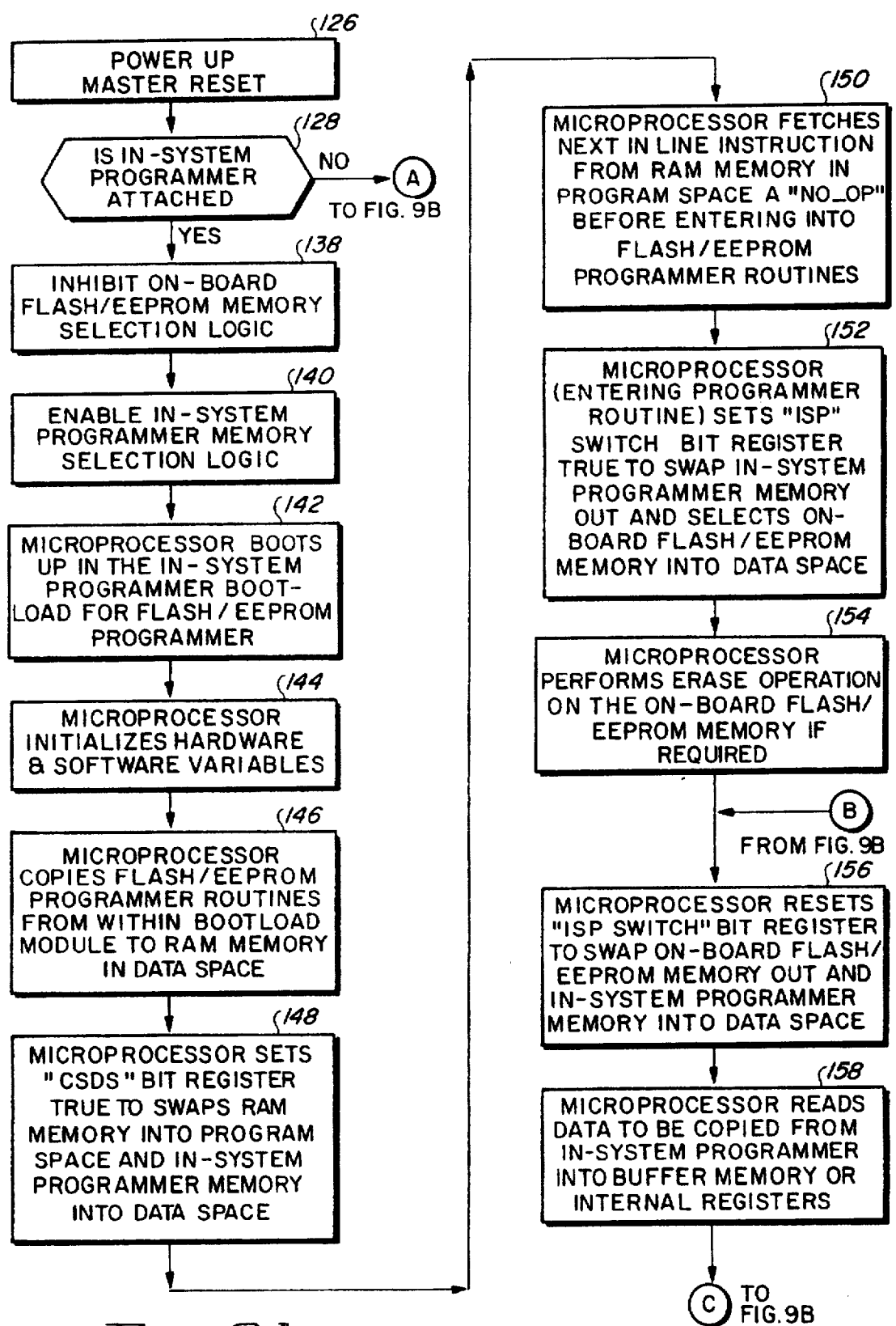
FIGS. 9A and 9B together are a flow diagram illustrating a FLASH/EEPROM programmer control process of the in-system programmer with bootload module of FIG. 6.
Figure 9B:
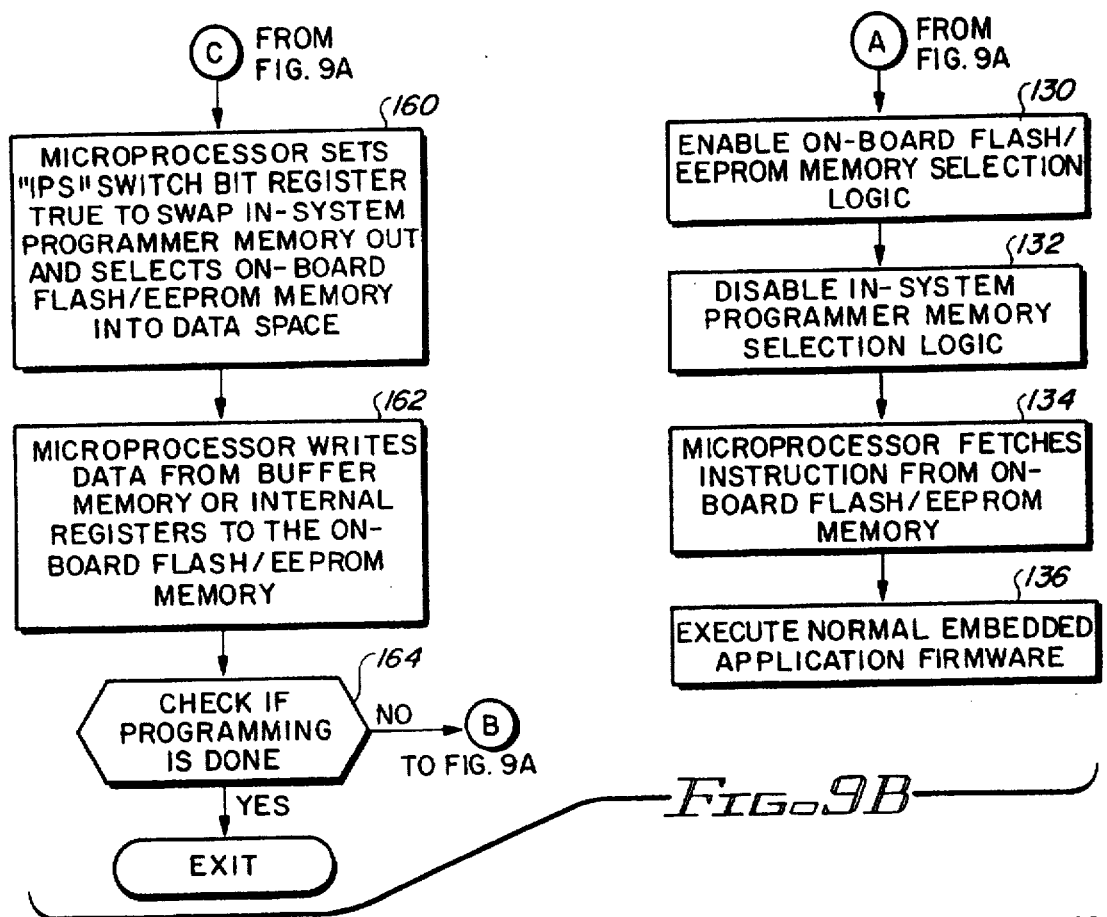
Figure 10:
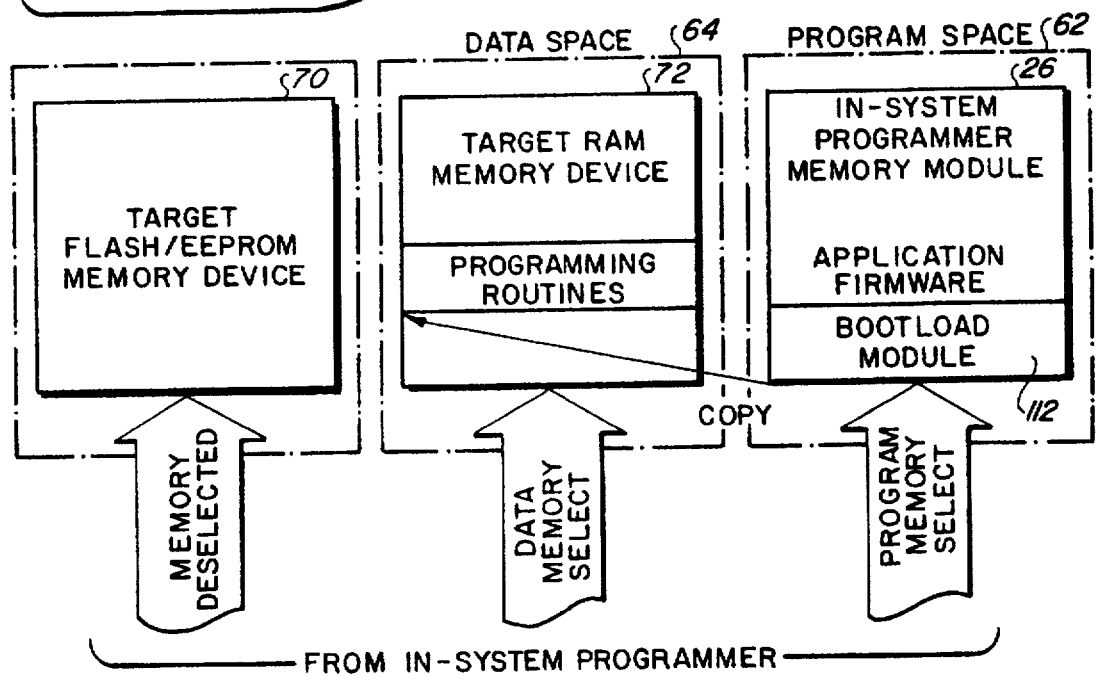
FIG. 10 is a microprocessor memory map similar to that shown in FIG. 6, illustrating the results of a bootload sequence.

FIG. 9 illustrates the in-system programmer FLASH/EEPROM programmer process utilized to invoke the in-system programmer with boot rom firmware. On power-up of the system 20, the master reset latches the in-system programmer status register (block 126), and then a determination is made whether the in-system programmer, and specifically the memory module 26, is attached (block 128). If not, the on-board flash/eeprom memory selection logic is enabled (block 130), and the in-system programmer memory selection logic is disabled (block 132). The microprocessor 24 then fetches instructions from the on-board flash/eeprom memory 70 (block 134) and begins executing the normal embedded application firmware (block 136).

If, however, attachment of the memory module 26 is detected, the on-board flash/eeprom memory selection logic is inhibited (block 138), and the in-system programmer memory selection logic is enabled instead (block 140). The microprocessor 24 then utilizes the boot load firmware of the boot load module 112 in the memory module 26 (block 142), and then initializes hardware and software variables (block 144). See FIG. 6. The microprocessor 24 then copies flash/eeprom programmer routines from within the boot load module 112 to ram memory of the target ram memory device 72 in the data space 64 (block 146). See FIG. 10.

The microprocessor 24 then sets the CSDS bit register to True to swap RAM memory into program space 62, and in-system programmer memory into data space 64 (block 148). See FIG. 11. The microprocessor then fetches next in line instruction from ram memory in the program space 62 a "no-op" before entering into flash/eeprom programmer routines (block 150). The microprocessor, upon entering the programmer routine, sets ISP SWITCH bit register True to swap in-system programmer memory out and selects on-board flash/eeprom memory into the data space 64 (block 152). See FIG. 12.

The microprocessor 24 then performs an erase operation on the on-board flash/eeprom memory 70 if required (block 154), and resets the ISP SWITCH bit register False to swap on-board flash/eeprom memory 70 out and in-system programmer memory into data space 64 (block 156). See FIG. 11. The microprocessor then reads data to be copied from the in-system programmer into buffer memory or an internal registers (block 158), and sets the BS SWITCH bit register True to swap in-system programmer memory out and selects on-board flash/eeprom memory 70 into the data space 64 (block 160). See FIG. 12. The microprocessor then writes data from the buffer memory or internal registers to on-board flash/eeprom memory 70 (block 162).

If the programming of the target flash/eeprom memory device 70 is done (block 164), the programmer control process is completed. If not, a portion of the process is repeated beginning with the step shown in block 156.

From the foregoing it will be appreciated that the in-system programmer of the present is a most effective and flexible method for programming flash/eeprom memory for mass production design. Off-line testing, data collection, high security data and coder/decoder, and other future applications can be added without changing the in-system programmer hardware design. Although two particular embodiments of the invention have been described in detail for purposes of illustration, various modifications may be made without departing from the spirit and scope of the invention. Accordingly, the invention is not to be limited, except as by the appended claims.

I claim:

1. A process for programing electrically erasable and programmable non-volatile memory in a computer system, comprising the steps of:
    attaching a memory module to a bus of a target microprocessor;
    detecting attachment of the memory module to the target microprocessor bus on power-up of the computer system;
    inhibiting on-board flash/eeprom memory selection logic of the computer system; and
    enabling in-system programmer control logic embedded within the computer system and accessible to the microprocessor, such that the microprocessor fetches instructions from the attached memory module rather than an on-board flash/eeprom memory.

2. The process of claim 1 including the step of executing in-system programmer firmware embedded in the memory module rather than application firmware of the on-board flash/eeprom memory.

3. The process of claim 1 including the steps of removing the memory module from the target microprocessor bus, detecting disattachment of the memory module from the target microprocessor bus, disabling the in-system programmer control logic, and enabling the on-board flash/eeprom memory selection logic such that the microprocessor fetches instructions from the on-board flash/eeprom memory rather than the memory module.

4. The process of claim 3 including the step of executing embedded application firmware of the on-board flash/eeprom memory, rather than in-system programmer firmware embedded in the memory module.

5. The process of claim 1 including the steps of:
    copying programming routines within the memory module to ram memory in a data space;
    swapping the ram memory into a program space, and in-system programmer firmware embedded in the memory module into the data space; and
    copying data from the in-system programmer firmware to the on-board flash/eeprom memory.

6. The process of claim 5 wherein the step of copying data from the in-system programmer firmware to the on-board flash/eeprom memory, includes the steps of reading data to be copied from the in-system programmer firmware into a buffer memory/internal register, swapping the in-system programmer firmware out of the data space and the on-board flash/eeprom memory into the data space, and writing data from the buffer memory/internal register to the on-board flash/eeprom memory.

7. The process of claim 5 including the step of performing an erase operation on the on-board flash/eeprom memory, if required, prior to the step of copying data from the in-system programmer firmware to the on-board flash/eeprom memory.

8. The process of claim 7 wherein the erase operation performing step includes the steps of swapping the in-system programmer firmware out of the data space and the on-board flash/eeprom memory into the data space prior to erasing the on-board flash/eeprom memory, and swapping the on-board flash/eeprom memory out of the data space and the in-system programmer firmware back into the data space afterwards.

9. The process of claim 8 wherein the step of copying data from the in-system programmer firmware to the on-board flash/eeprom memory, includes the steps of reading data to be copied from the in-system programmer firmware into a buffer memory/internal register, swapping the in-system programmer firmware out of the data space and the on-board flash/eeprom memory into the data space, and writing data from the buffer memory/internal register to the on-board flash/eeprom memory.

10. The process of claim 5 including the steps of removing the memory module from the target microprocessor bus, detecting disattachment of the memory module from the target microprocessor bus, disabling the in-system programmer control logic, and enabling the on-board flash/eeprom memory selection logic such that the microprocessor fetches instructions from the on-board flash/eeprom memory rather than the memory module.

11. The process of claim 10 including the step of executing embedded application firmware of the on-board flash/eeprom memory rather than the in-system programmer firmware embedded in the memory module.

12. A process for programming electrically erasable and programmable memory, comprising the steps of:

connecting a memory module of an in-system programmer to a bus of a target microprocessor;

enabling control logic for the in-system programmer such that the microprocessor fetches instructions from the memory module rather than an on-board flash/eeprom memory;

swapping ram memory in a data space into a program space, and in-system firmware into the data space; and cloning at least a portion of the in-system firmware within the on-board flash/eeprom memory.

13. The process of claim 12 including the step of performing an erase operation on the on-board flash/eeprom memory, if required, prior to the cloning step.

14. The process of claim 13 wherein the erase operation performing step includes the steps of swapping the in-system firmware out of the data space and the on-board flash/eeprom memory into the data space prior to erasing the on-board flash/eeprom memory, and swapping the on-board flash/eeprom memory out of the data space and the in-system firmware back into the data space afterwards.

15. The process of claim 12 including the steps of removing the memory module from the target microprocessor bus, detecting disattachment of the memory module from the target microprocessor bus, disabling the in-system programmer control logic, enabling the on-board flash/eeprom memory such that the microprocessor fetches instructions from the on-board flash/eeprom memory rather than the memory module, and executing embedded application firmware of the on-board flash/eeprom memory rather than the in-system firmware.

16. The process of claim 12 wherein the cloning step includes the steps of reading data to be copied from the in-system firmware into a buffer memory/internal register, swapping the in-system firmware out of the data space and the on-board flash/eeprom memory into the data space, and writing data from the buffer memory/internal register to the on-board flash/eeprom memory.

17. The process of claim 16 including the step of copying programming routines within the memory module to the ram memory prior to the step of swapping the ram memory in the data space into a program space.

18. The process of claim 17 including the step of performing an erase operation on the on-board flash/eeprom memory, if required, prior to the cloning step.

19. The process of claim 12 wherein the enabling step includes the step of detecting attachment of the memory module to the target microprocessor bus on power-up of an associated computer system.

20. The process of claim 12 wherein the enabling step includes the step of inhibiting embedded selection logic for the on-board flash/eeprom memory.

21. A device for in-system programming electrically erasable and programmable non-volatile memory in a computer system including a target microprocessor and on-board flash/eeprom memory, the device comprising:

an external memory module;

means for attaching the memory module to a bus of the target microprocessor;

means for detecting attachment of the memory module to the target microprocessor bus on power-up of the computer system;

means for inhibiting on-board flash/eeprom memory selection logic of the computer system;

means for performing an erase operation on the on-board flash/eeprom memory, if required;

means for enabling in-system programmer control logic embedded within the computer system and accessible to the microprocessor, such that the microprocessor fetches instructions from the attached memory module rather than the on-board flash/eeprom memory, the enabling means including means for copying programming routines within the memory module to ram memory in a data space, means for swapping the ram memory in a program space and in-system programmer firmware embedded in the memory module into the data space, and means for copying data from the in-system programmer firmware to the on-board flash/eeprom memory; and means for executing in-system programmer firmware embedded in the memory module rather than application firmware of the on-board flash/eeprom memory.

22. The device of claim 21 including means for permitting removal of the memory module from the target microprocessor bus, means for detecting disattachment of the memory module from the target microprocessor bus, means for disabling the in-system programmer control logic, and means for enabling the on-board flash/eeprom memory selection logic such that the microprocessor fetches instructions from the on-board flash/eeprom memory rather than the memory module following removal of the memory module.

23. The device of claim 21, wherein the erase operation performing means includes means for swapping the in-system programer firmware out of the data space and the on-board flash/eeprom memory into the data space prior to erasing the on-board flash/eeprom memory, and means for swapping the on-board flash/eeprom memory out of the data space and the in-system programmer firmware back into the data space afterwards.

24. A process for programing electrically erasable and programmable non-volatile memory in a computer system, comprising the steps of:

attaching a memory module to a bus of a target microprocessor;

detecting attachment of the memory module to the target microprocessor bus on power-up of the computer system;

inhibiting on-board flash/eeprom memory selection logic of the computer system;

copying programming routines within the memory module to ram memory in a data space;

swapping the ram memory into a program space, and in-system programmer firmware embedded in the memory module into the data space;

copying data from the in-system programmer firmware to an on-board flash/eeprom memory; and performing an erase operation on the on-board flash/eeprom memory, if required, prior to the step of copying data from the in-system programmer firmware to the on-board flash/eeprom memory, wherein the erase operation performing step includes the steps of swapping the in-system programmer firmware out of the data space and the on-board flash/eeprom memory into the data space prior to erasing the on-board flash/eeprom memory, and swapping the on-board flash/eeprom memory out of the data space and the in-system programmer firmware back into the data space afterwards.

25. The process of claim 24 wherein the step of copying data from the in-system programmer firmware to the on-board flash/eeprom memory, includes the steps of reading data to be copied from the in-system programmer firmware into a buffer memory/internal register, swapping the in-system programmer firmware out of the data space and the on-board flash/eeprom memory into the data space, and writing data from the buffer memory/internal register to the on-board flash/eeprom memory.

26. The process of claim 24 including the steps of removing the memory module from the target microprocessor bus, detecting disattachment of the memory module from the target microprocessor bus, disabling in-system programmer control logic, and enabling the on-board flash/eeprom memory selection logic such that the microprocessor fetches instructions from the on-board flash/eeprom memory rather than the memory module.

27. The process of claim 26 including the step of executing embedded application firmware of the on-board flash/eeprom memory rather than the in-system programmer firmware embedded in the memory module.

28. A process for programming electrically erasable and programmable memory, comprising the steps of:
    connecting a memory module of an in-system programmer to a bus of a target microprocessor;
    enabling control logic for the in-system programmer such that the microprocessor fetches instructions from the memory module rather than an on-board flash/eeprom memory;
    swapping ram memory in a data space into a program space, and in-system firmware into the data space;
    performing an erase operation on the on-board flash/eeprom memory, if required, including the steps of swapping the in-system firmware out of the data space and the on-board flash/eeprom memory into the data space prior to erasing the on-board flash/eeprom memory, and swapping the on-board flash/eeprom memory out of the data space and the in-system firmware back into the data space afterwards; and cloning at least a portion of the in-system firmware within the on-board flash/eeprom memory, wherein the cloning step includes the steps of reading data to be copied from the in-system firmware into a buffer memory/internal register, swapping the in-system firmware out of the data space and the on-board flash/eeprom memory into the data space, and writing data from the buffer memory/internal register to the on-board flash/eeprom memory.

29. The process of claim 28 including the steps of removing the memory module from the target microprocessor bus, detecting disattachment of the memory module from the target microprocessor bus, disabling the in-system programmer control logic, enabling the on-board flash/eeprom memory such that the microprocessor fetches instructions from the on-board flash/eeprom memory rather than the memory module, and executing embedded application firmware of the on-board flash/eeprom memory rather than the in-system firmware.

30. The process of claim 28 including the step of copying programming routines within the memory module to the ram memory prior to the step of swapping the ram memory in the data space into a program space.

31. The process of claim 30 including the step of performing an erase operation on the on-board flash/eeprom memory, if required, prior to the cloning step.

32. The process of claim 28 wherein the enabling step includes the step of detecting attachment of the memory module to the target microprocessor bus on power-up of an associated computer system.

33. The process of claim 28 wherein the enabling step includes the step of inhibiting embedded selection logic for the on-board flash/eeprom memory.

* * * * *